United States Patent
Tezuka et al.

(10) Patent No.: US 11,376,554 B2
(45) Date of Patent: *Jul. 5, 2022

(54) POROUS POLYTETRAFLUOROETHYLENE MEMBRANE, AND WATERPROOF AIR-PERMEABLE MEMBRANE AND WATERPROOF AIR-PERMEABLE MEMBER INCLUDING THE SAME

(71) Applicant: NITTO DENKO CORPORATION, Ibaraki (JP)

(72) Inventors: Teppei Tezuka, Osaka (JP); Youzou Yano, Osaka (JP); Kazuhiro Omura, Osaka (JP); Tomoyuki Kasagi, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 460 days.

This patent is subject to a terminal disclaimer.

(21) Appl. No.: 16/470,920

(22) PCT Filed: Dec. 18, 2017

(86) PCT No.: PCT/JP2017/045397
§ 371 (c)(1),
(2) Date: Jun. 18, 2019

(87) PCT Pub. No.: WO2018/117055
PCT Pub. Date: Jun. 28, 2018

(65) Prior Publication Data
US 2020/0086283 A1    Mar. 19, 2020

(30) Foreign Application Priority Data

Dec. 19, 2016 (JP) .............................. JP2016-245967
Aug. 1, 2017 (JP) .............................. JP2017-148904

(51) Int. Cl.
*B01D 53/22* (2006.01)
*B01D 71/36* (2006.01)
(Continued)

(52) U.S. Cl.
CPC .......... *B01D 71/36* (2013.01); *B01D 53/268* (2013.01); *B01D 69/02* (2013.01); *B01D 69/10* (2013.01);
(Continued)

(58) Field of Classification Search
CPC ........ B01D 69/10; B01D 69/02; B01D 71/36; B01D 2325/02; B01D 53/268;
(Continued)

(56) References Cited

U.S. PATENT DOCUMENTS 3,962,153 A    6/1976    Gore
4,482,516 A    11/1984   Bowman et al.
(Continued)

FOREIGN PATENT DOCUMENTS

JP    S5022881    3/1975
JP    H07508548   9/1995
(Continued)

OTHER PUBLICATIONS

International Search Report issued for International Patent Application No. PCT/JP2017/045397, dated Mar. 20, 2018, 5 pages including English translation.
(Continued)

*Primary Examiner* — Anthony R Shumate
(74) *Attorney, Agent, or Firm* — Hamre, Schumann, Mueller & Larson, P.C.

(57) ABSTRACT

A porous polytetrafluoroethylene (PTFE) membrane of the present disclosure is a membrane having an average fibril length of 50 μm or more, having an average node length 5 or more times larger than the average fibril length, and
(Continued)

having an average node area ratio of 5% or less. The porous PTFE membrane of the present disclosure, when attached as a waterproof air-permeable membrane to a housing of an electrical component or electrical device, allows water vapor residing inside the housing to be quickly discharged out of the housing.

7 Claims, 5 Drawing Sheets

(51) Int. Cl.

| | |
|---|---|
| B01D 53/26 | (2006.01) |
| B01D 69/02 | (2006.01) |
| B01D 69/10 | (2006.01) |
| C08J 5/18 | (2006.01) |
| C08J 9/228 | (2006.01) |
| H05K 5/02 | (2006.01) |
| B29D 99/00 | (2010.01) |
| C08J 3/11 | (2006.01) |
| B29K 27/18 | (2006.01) |

(52) U.S. Cl.
CPC ............... *B29D 99/005* (2013.01); *C08J 3/11* (2013.01); *C08J 5/18* (2013.01); *C08J 9/228* (2013.01); *H05K 5/0213* (2013.01); B01D 2325/02 (2013.01); B29K 2027/18 (2013.01); C08J 2327/18 (2013.01)

(58) Field of Classification Search
CPC ... B29K 2027/18; C08J 9/228; C08J 2327/18; C08J 3/11; C08J 5/18; B29D 99/005
See application file for complete search history.

(56) References Cited

U.S. PATENT DOCUMENTS

| | | | | |
|---|---|---|---|---|
| 4,598,011 | A * | 7/1986 | Bowman | B29C 55/005 |
| | | | | 428/221 |
| 4,862,730 | A | 9/1989 | Crosby | |
| 4,877,661 | A * | 10/1989 | House | B29C 55/005 |
| | | | | 428/34.9 |
| 4,916,110 | A * | 4/1990 | Manniso | B01J 35/04 |
| | | | | 205/112 |
| 5,234,739 | A * | 8/1993 | Tanaru | B29C 55/005 |
| | | | | 428/131 |
| 5,474,824 | A * | 12/1995 | Martakos | A61F 2/06 |
| | | | | 428/36.9 |
| 5,529,820 | A * | 6/1996 | Nomi | A61L 29/041 |
| | | | | 428/36.4 |
| 5,547,551 | A | 8/1996 | Bahar et al. | |
| 5,599,614 | A | 2/1997 | Bahar et al. | |
| 5,708,044 | A | 1/1998 | Branca | |
| 5,747,128 | A * | 5/1998 | Campbell | A61B 17/12109 |
| | | | | 428/35.7 |
| 5,800,522 | A * | 9/1998 | Campbell | A61B 17/12022 |
| | | | | 128/898 |
| 5,814,405 | A | 9/1998 | Branca et al. | |
| 5,834,528 | A | 11/1998 | Tanaka et al. | |
| 5,858,505 | A * | 1/1999 | Moen | B26F 1/18 |
| | | | | 428/131 |
| 6,132,470 | A * | 10/2000 | Berman | A61L 31/048 |
| | | | | 623/23.15 |
| 6,875,386 | B1 * | 4/2005 | Ward | A61L 29/085 |
| | | | | 264/154 |
| 2001/0042716 | A1 | 11/2001 | Iversen et al. | |
| 2005/0186367 | A1 | 8/2005 | Hanrahan | |
| 2008/0307971 | A1 | 12/2008 | Horie et al. | |
| 2009/0277141 | A1 | 11/2009 | Abe et al. | |
| 2010/0051535 | A1 | 3/2010 | Hokazono | |
| 2013/0068689 | A1 | 3/2013 | Bansal et al. | |
| 2013/0087500 | A1 * | 4/2013 | Ishizuka | B01D 67/002 |
| | | | | 210/500.22 |
| 2013/0097982 | A1 | 4/2013 | Inui et al. | |
| 2014/0283691 | A1 | 9/2014 | Furuuchi | |
| 2015/0050877 | A1 | 2/2015 | Yano et al. | |
| 2015/0082757 | A1 | 3/2015 | Chaen et al. | |
| 2016/0228826 | A1 | 8/2016 | Furuuchi | |
| 2016/0325238 | A1 | 11/2016 | Uchiyama | |
| 2016/0369971 | A1 | 12/2016 | Tezuka et al. | |
| 2017/0001155 | A1 | 1/2017 | Chaen et al. | |
| 2019/0268679 | A1 * | 8/2019 | Kurihara | H04R 1/086 |
| 2020/0086282 | A1 * | 3/2020 | Tezuka | C08J 9/228 |
| 2020/0214368 | A1 | 7/2020 | Blakely et al. | |

FOREIGN PATENT DOCUMENTS

| | | |
|---|---|---|
| JP | H07292144 | 11/1995 |
| JP | H09156007 | 6/1997 |
| JP | H10165787 | 6/1998 |
| JP | 2002035558 | 2/2002 |
| JP | 2003326661 | 11/2003 |
| JP | 2005342718 | 12/2005 |
| JP | 2007523247 | 8/2007 |
| JP | 2007314713 | 12/2007 |
| JP | 2008536558 | 9/2008 |
| JP | 2010058024 | 3/2010 |
| JP | 2012045524 | 3/2012 |
| JP | 2013053195 | 3/2013 |
| JP | 2013067076 | 4/2013 |
| JP | 2013229281 | 11/2013 |
| JP | 2014184418 | 10/2014 |
| JP | 2014207590 | 10/2014 |
| JP | 2015109206 | 6/2015 |
| JP | 2015111816 | 6/2015 |
| JP | 2015127023 | 7/2015 |
| JP | 2015127413 | 7/2015 |
| JP | 2015205979 | 11/2015 |
| JP | 2016000817 | 1/2016 |
| JP | 2016155286 | 9/2016 |
| JP | 2016531218 | 10/2016 |
| WO | 9400511 | 1/1994 |
| WO | 2006113086 | 10/2006 |
| WO | 2015041779 | 3/2015 |
| WO | 2016149400 | 9/2016 |

OTHER PUBLICATIONS

Extended European Search Report issued in European Patent Application No. 17885315.6, dated Jun. 8, 2020, 7 pages.
U.S. Appl. No. 16/470,894, filed Jun. 18, 2019, US 2020-0086282 A1.
International Search Report issued for International Patent Application No. PCT/JP2017/045398, dated Mar. 20, 2018, 5 pages including English translation.
Huang, et al., "Study of a new novel process for preparing and co-stretching PTFE membrane and its properties", European Polymer Journal, vol. 40, No. 4, pp. 667-671, Apr. 1, 2004.
Extended European Search Report issued in European Patent Application No. 17883832.2, dated Jun. 26, 2020, 9 pages.
Office Action issued for European Patent Application No. 17883832.2, dated Jun. 30, 2021, 5 pages.
Advantec Catalog, Advantec MFS, Inc, 2021, vol. 15, 3 pages. (Year: 2021).
English language machine translation for JP 2007-314713. Retrieved from translationportal.epo.org on Sep. 27, 2021 (Year: 2021) 21 pages.
El-Bourawi, M.S. et al., "A framework for better understanding membrane distillation separation process," Journal of Membrane Science 285 (2006) pp. 4-29.
Office Action issued for Korean Patent Application No. 10-2019-7020683, dated Apr. 6, 2022, 16 pages including English machine translation.

(56) References Cited

OTHER PUBLICATIONS

Office Action issued for Korean Patent Application No. 10-2019-7020685, dated Apr. 6, 2022, 15 pages including English machine translation.

\* cited by examiner (a)

(b)

US 11,376,554 B2

POROUS POLYTETRAFLUOROETHYLENE MEMBRANE, AND WATERPROOF AIR-PERMEABLE MEMBRANE AND WATERPROOF AIR-PERMEABLE MEMBER INCLUDING THE SAME

TECHNICAL FIELD

The present invention relates to a porous polytetrafluoroethylene (hereinafter referred to as "PTFE") membrane and to a waterproof air-permeable membrane and waterproof air-permeable member including the porous PTFE membrane.

BACKGROUND ART

Housings of electrical components for vehicles, such as lamps, pressure sensors, electronic control units (ECUs), and secondary battery-containing cases, and of various other electrical products may be fitted with waterproof air-permeable membranes. The attachment of a waterproof air-permeable membrane to a housing ensures an airflow path between the outside and inside of the housing, thus making it possible to reduce pressure variation caused by temperature change inside the housing and discharge a gas generated inside the housing to the outside of the housing. The waterproof air-permeable membrane can also reduce entry of foreign matter such as water and/or dust from the outside into the inside of the housing via the airflow path.

A waterproof air-permeable membrane including a porous PTFE membrane is known. Patent Literature 1 discloses a porous PTFE membrane that can be used as a waterproof air-permeable membrane.

For housings of electrical components and electrical products, resins having relatively high moisture-absorbing capacity may be used, such as polyamide (PA), polycarbonate (PC), and polybutylene terephthalate (PBT). A housing for which such a resin is used absorbs ambient water vapor, and the absorbed water vapor is released due to heat from a heat source inside the housing or heat from an external source such as sunlight, and part of the water vapor resides inside the housing. It is desired that the water vapor residing inside the housing be discharged out of the housing as quickly as possible.

The waterproof air-permeable membrane acts as an obstacle to quick discharge of water vapor. Thus, it has been proposed to promote discharge of water vapor by forced convection. For example, Patent Literature 2 discloses a system having a piezoelectric blower attached to a housing in order to quickly discharge water vapor out of the housing. The use of natural convection has also been proposed. For example, a vehicle headlight disclosed in Patent Literature 3 includes a first air-permeable body attached forward of a light source of a lamp and a second air-permeable body attached rearward of the light source, and the amount of air passing through the first air-permeable body is larger than the amount of air passing through the second air-permeable body. This system exploits natural convection induced by heat emitted forward from the light source.

CITATION LIST

Patent Literature

Patent Literature 1: JP 50(1975)-22881 A
Patent Literature 2: JP 2013-229281 A
Patent Literature 3: JP 2015-109206 A

SUMMARY OF INVENTION

Technical Problem

An object of the present invention is to provide a new technique adapted to allow water vapor residing inside a housing to be quickly discharged out of the housing.

Solution to Problem

The present invention provides a porous PTFE membrane having an average fibril length of 50 µm or more, having an average node length 5 or more times larger than the average fibril length, and having an average node area ratio of 5% or less.

In another aspect, the present invention provides a waterproof air-permeable membrane including the above porous PTFE membrane of the present invention.

In still another aspect, the present invention provides a waterproof air-permeable member including the above waterproof air-permeable membrane of the present invention and a support joined to the waterproof air-permeable membrane.

Advantageous Effects of Invention

Any attempt to promote discharge of water vapor from a housing by an improvement to a porous PTFE membrane itself has not been made in the past.

The porous PTFE membrane according to the present invention can have unprecedentedly high water vapor permeability in a thickness direction of the membrane. The high water vapor permeability means a high rate of diffusive permeation of water vapor through the porous membrane. Thus, when the porous PTFE membrane according to the present invention is attached as a waterproof air-permeable membrane to a housing, water vapor residing inside the housing can be quickly discharged out of the housing. It should be noted that the water vapor permeability and air permeability (air permeation rate) of a membrane are different in concept. Discharge of water vapor "residing" inside a housing includes discharge of water vapor under a condition where there is no or little passage of air between the inside and outside of the housing. Discharge of water vapor residing inside a housing, including discharge under the above condition, cannot be promoted merely by an increase in air permeation rate of a membrane.

The porous PTFE membrane according to the present invention is adapted to allow water vapor to be quickly discharged from a housing without the aid of any ventilation means requiring energy input, such as a piezoelectric blower. Water vapor discharge employing the porous PTFE membrane according to the present invention has broad utility and is applicable not only to headlights but also to a wide variety of other products.

DESCRIPTION OF EMBODIMENTS

Figure 1:
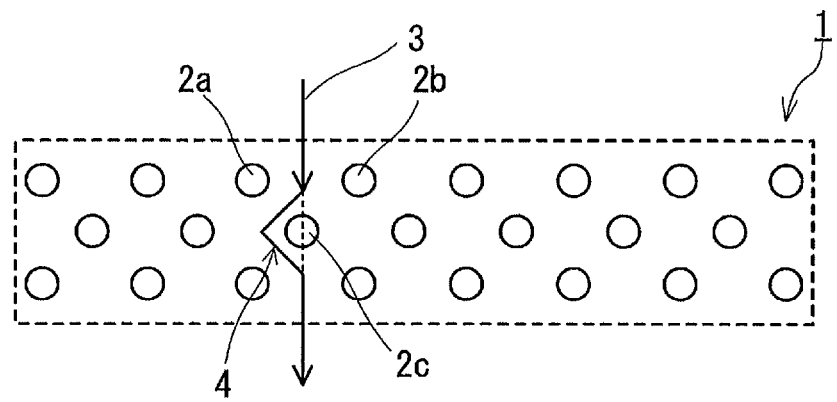
FIG. 1 is a schematic diagram for illustrating the influence of the average node area ratio of a porous PTFE membrane on the water vapor permeability of the membrane in the thickness direction of the membrane.

A porous PTFE membrane according to a first aspect of the present disclosure is a membrane having an average fibril length of 50 μm or more, having an average node length 5 or more times larger than the average fibril length, and having an average node area ratio of 5% or less.

In a second aspect of the present disclosure, for example, the porous PTFE membrane according to the first aspect is a membrane in which the average node area ratio is 3% or less.

In a third aspect of the present disclosure, for example, the porous PTFE membrane according to the first or second aspect is a membrane having an average tortuosity of 1.5 or less in a thickness direction of the membrane.

In a fourth aspect of the present disclosure, for example, the porous PTFE membrane according to any one of the first to third aspects is a membrane having a water entry pressure, as measured according to method B (high hydraulic pressure method) of water penetration test specified in JIS L 1092, of 10 kPa or more. It should be noted that the water entry pressure is evaluated based on a water pressure that causes water to leak from one region of the surface of the porous PTFE membrane.

In a fifth aspect of the present disclosure, for example, the porous PTFE membrane according to any one of the first to fourth aspects is a membrane having a porosity of 90% or more.

In a sixth aspect of the present disclosure, for example, the porous PTFE membrane according to any one of the first to fifth aspects is a membrane having a water vapor permeability, as measured according to JIS L 1099 (method B-1), of 150000 g/(m$^2$·day) or more in a thickness direction of the membrane.

A waterproof air-permeable membrane according to a seventh aspect of the present disclosure includes the porous PTFE membrane according to any one of the first to sixth aspects.

A waterproof air-permeable member according to an eighth aspect of the present disclosure includes the waterproof air-permeable membrane according to the seventh aspect and a support joined to the waterproof air-permeable membrane.

For the porous PTFE membrane of the present invention, the water vapor permeability as measured according to JIS L 1099 (method B-1) in the thickness direction of the membrane may be 150000 g/(m$^2$·day) or more. Depending on the structural features of the porous membrane, this water vapor permeability may be more than 150000 g/(m$^2$·day), 155000 g/(m$^2$·day) or more, 160000 g/(m$^2$·day) or more, 180000 g/(m$^2$·day) or more, or even 200000 g/(m$^2$·day) or more. The upper limit of the water vapor permeability is not limited to any particular value, and the water vapor permeability is, for example, 300000 g/(m$^2$·day) or less. For the porous PTFE membrane of the present invention, a water vapor permeability as measured according to JIS Z 0208 (water vapor permeability test, cup or dish method) in the thickness direction of the membrane is, for example, 9000 g/(m$^2$·day) or more and may, depending on the structural features of the porous membrane, be 10000 g/(m$^2$·day) or more or even 11000 g/(m$^2$·day) or more. The upper limit of this water vapor permeability is not limited to any particular value, and the water vapor permeability is, for example, 16000 g/(m$^2$·day) or less.

If a test specimen whose water vapor permeability is to be measured is so small in size that the test specimen cannot be subjected to the measurement according to JIS by itself, an auxiliary plate may be used for the measurement of the water vapor permeability. For example, the method specified in JIS L 1099 (method B-1) requires that the opening of a dish containing a moisture absorber (a potassium acetate solution) be pressed against a test specimen with a size of about 200×200 mm that is fixed by a test specimen-supporting frame. If the size of a test specimen is smaller than the specified size, the test specimen may be fixed to an auxiliary plate having an outer shape conforming to the shape of the inner circumference (the shape of an about 80-mm-diameter circle) of the test specimen-supporting frame in such a manner that the test specimen covers an opening made at the center of the auxiliary plate, and the auxiliary plate may be fixed inside the supporting frame. The fixation of the test specimen to the auxiliary plate and the fixation of the auxiliary plate to the supporting frame may be accomplished by using double-coated adhesive tapes. A plate made of metal such as stainless steel is suitable as the auxiliary plate. In actual measurement performed by the present inventors, a measurement value obtained with the use of an auxiliary plate was in good agreement with a measurement value obtained without the use of any auxiliary plate even though the size of the opening made in the auxiliary plate was smaller than the effective area (about 24.6 cm$^2$) of the dish. The measurement method using an auxiliary plate is effectively applicable also to the method of JIS Z 0208 (water vapor permeability test, dish method) in which calcium chloride is used as the moisture absorber.

Also in the case of measurement by method B (high hydraulic pressure method) of water penetration test specified in JIS L 1092, an auxiliary plate can be used when the test specimen to be subjected to the measurement has a size smaller than the test specimen size (about 150 mm×150 mm) specified in JIS. An example of the auxiliary plate is a 47-mm-diameter stainless steel plate provided at its center with a circular opening of 6 mm diameter. Also for the measurement of water entry pressure, it has been confirmed that the use of an auxiliary plate has no substantial influence on measurement values.

A porous PTFE membrane of the present invention is a membrane having an average fibril length of 50 μm or more, having an average node length 5 or more times larger than the average fibril length, and having an average node area ratio of 5% or less. Hereinafter, the porous PTFE membrane of the present invention which has such a membrane structure may be referred to as "porous membrane A".

A porous PTFE membrane is generally composed of nodes (knot-like portions) formed of aggregated PTFE and a huge number of fibrils which are fine fibrous bodies having both ends joined to the nodes. The adjacent nodes are connected via the fibrils. The porous PTFE membrane has air permeability in the thickness direction of the membrane, the air permeability being attributed to the fact that voids (pores) between the adjacent fibrils serve as airflow paths. The porous PTFE membrane is also called a stretched porous membrane and is formed by stretching a PTFE sheet which is a PTFE aggregate. Stretching the PTFE sheet results in formation of the nodes and fibrils, the configuration of which may vary depending on, for example, the conditions of the stretching of the PTFE sheet.

The porous PTFE membrane A has an average fibril length, an average node length, and an average node area ratio within specific ranges. Thus, the porous PTFE membrane A can have high water vapor permeability in the thickness direction of the membrane.

In passing through a porous PTFE membrane, water vapor has to undergo diffusive migration in such a way as to bypass the nodes and fibrils of the membrane. Thus, if the nodes and fibrils are configured to allow the diffusion paths of water vapor to extend as straight as possible in the thickness direction of the porous membrane, the water vapor permeability of the porous membrane in the thickness direction will be high. The above average fibril length, average node length, and average node area ratio within the specific ranges are suitable for establishing straight diffusion paths of water vapor in a porous PTFE membrane.

Figure 2:
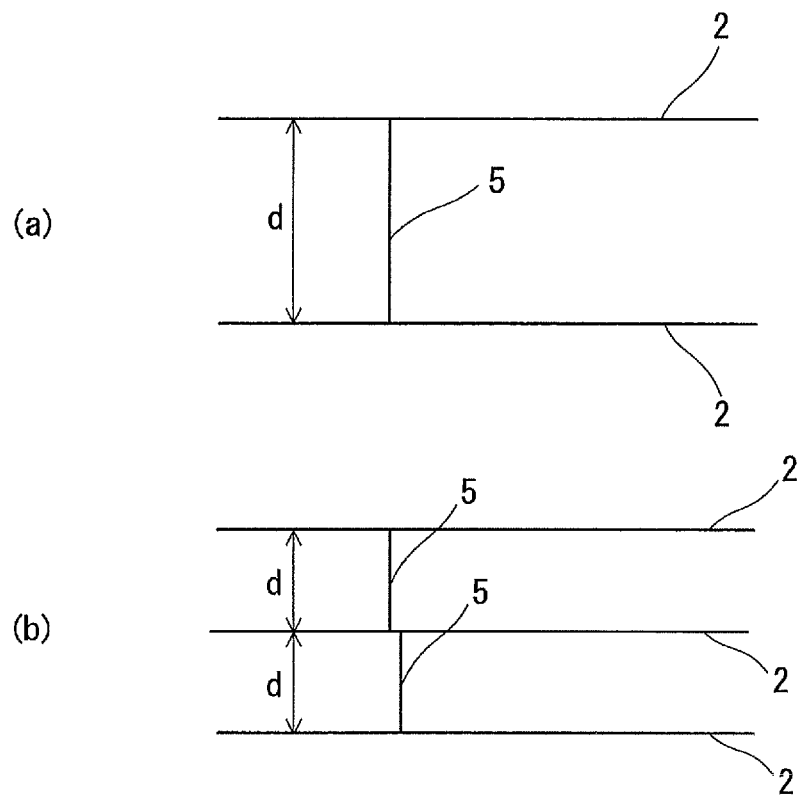
FIG. 2 is a schematic diagram for illustrating the influence of the average fibril length of a porous PTFE membrane on the water vapor permeability of the membrane in the thickness direction of the membrane.
Figure 3:
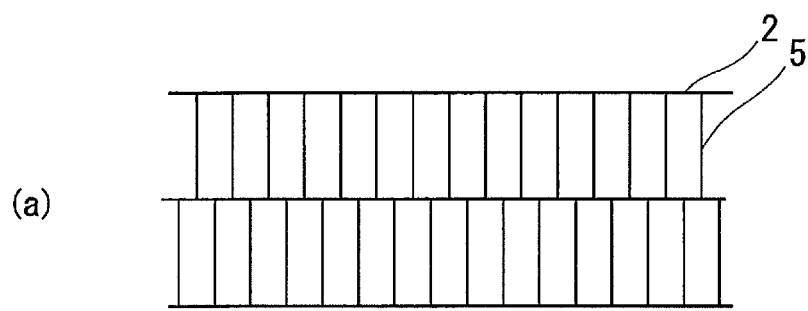
FIG. 3 is a schematic diagram for illustrating the influence of the average node length of a porous PTFE membrane on the water vapor permeability of the membrane in the thickness direction of the membrane.
Figure 3:
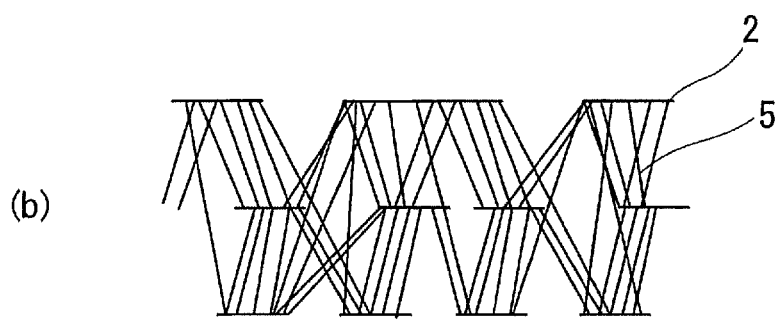

The average node area ratio will now be described. As shown in FIG. 1, when a porous PTFE membrane 1 is viewed in a cross-section along the thickness direction of the membrane, the cross-section includes a plurality of nodes 2a, 2b, 2c . . . distributed in both the in-plane direction and thickness direction of the porous membrane 1. For simplicity and clarity of illustration, FIG. 1, and FIGS. 2 and 3 referred to later, show an embodiment in which the nodes 2 extend in the same direction. However, this is not intended to limit the present invention to such an embodiment. In diffusive migration in the thickness direction of the porous membrane 1, water vapor 3 has to move in such a way as to bypass the nodes 2 acting as obstacles to the diffusion. Thus, for example, the water vapor 3 having passed by the nodes 2a and 2b is prevented by the presence of the node 2c from undergoing diffusive migration on a straight path in the thickness direction of the porous membrane 1 and is forced to take a diffusion path 4 bypassing the node 2c. In a real-world PTFE membrane, such bypassing movement of the water vapor 3 is repeated during passage of the water vapor 3 through the porous membrane 1 in the thickness direction. The water vapor permeability of the porous membrane 1 increases as the diffusion path 4 of water vapor approximates to a straight line, and the water vapor permeability decreases as the diffusion path departs from a straight line. The average node area ratio of the porous PTFE membrane A is 5% or less, and this can reduce the extent to which water vapor passing through the porous membrane in the thickness direction is obstructed by the nodes 2a, 2b, 2c . . . present on the diffusion path 4, thus allowing the diffusion path 4 to approximate to a straight line extending in the thickness direction.

The average node area ratio of the porous PTFE membrane A is preferably 3% or less and more preferably 2.5% or less. The lower limit of the average node area ratio is, for example, 1.0%. The porous PTFE membrane A having an average node area ratio of 1.0% or more is suitable for achieving waterproof property desired for use as a waterproof air-permeable membrane.

Next, the average fibril length will be described. As shown in (a) and (b) of FIG. 2, a fibril 5 (only one fibril is shown for simplicity and clarity of illustration) of the porous PTFE membrane 1 has both ends connected to the nodes 2. That is, the average length of the fibrils 5 (average fibril length) reflects the distance d between the adjacent nodes 2. That is, the larger the average fibril length of a porous PTFE membrane is, the longer the distance between the adjacent nodes 2 in the membrane is. When the distance between the adjacent nodes 2 in a porous PTFE membrane is long, it is possible to reduce the extent to which water vapor passing through the porous membrane in the thickness direction is obstructed by the nodes 2a, 2b, 2c . . . present on the diffusion path 4, thus allowing the diffusion path 4 to approximate to a straight line extending in the thickness direction.

The average fibril length of the porous PTFE membrane A is 50 μm or more, which means that the distance between the adjacent nodes is long. An increase in average fibril length provides an improvement in water vapor permeability indeed; however, an extremely large average fibril length coupled with a low average node area ratio may deteriorate the strength and/or waterproof property of the porous membrane. In view of this, the average fibril length of the porous PTFE membrane A is preferably 90 μm or less. When the average fibril length is 90 μm or less, the waterproof property of the porous PTFE membrane A used as a waterproof air-permeable membrane can be reliably improved.

Next, the average node length will be described. In diffusive migration in the thickness direction of the porous PTFE membrane 1, water vapor moves in voids (pores) between the fibrils 5 in such a way as to bypass not only the nodes 2 but also the fibrils 5. As shown in (a) and (b) of FIG. 3, each fibril 5 of the porous PTFE membrane has both ends connected to the nodes 2. When a porous membrane has a large average fibril length as described above and the ratio of the average node length to the average fibril length is small as shown in (b) of FIG. 3, there is a high proportion of fibrils 5 extending obliquely to a direction perpendicular to a direction in which the nodes 2 extend, and a huge number of such fibrils 5 exist for each of a large number of the nodes 2 distributed in the in-plane and thickness directions of the membrane. In this porous membrane 1 considered as a whole, the directions in which the fibrils 5 extend are random. By contrast, when a porous membrane has a large average fibril length as described above and the ratio of the average node length to the average fibril length is large as shown in (a) of FIG. 3, there is a high proportion of fibrils 5 extending in a direction perpendicular to the direction in which the nodes 2 extend and fibrils 5 extending in a direction close to the perpendicular direction (the direction close to the perpendicular direction may hereinafter be referred to as "approximately perpendicular direction"). In this porous membrane 1 considered as a whole, the fibrils 5 extend predominantly (uniformly) in the perpendicular or approximately perpendicular direction. In one of the most ideal embodiments, the porous membrane as viewed in a direction perpendicular to the principal surfaces of the porous membrane can have what may be called a "ladder-like" porous structure in which the two adjacent nodes 2 are "posts" and the fibrils 5 are "rails" extending approximately perpendicularly to the direction in which the two nodes 2 extend and connecting the two nodes 2 to each other. In the porous membrane of (a) of FIG. 3, in which the fibrils 5 extend in relatively uniform directions, the diffusion path 4 of water vapor diffusing through the voids between the fibrils 5 in such a way as to bypass the fibrils 5 is closer to a straight line extending in the thickness direction of the membrane than in the porous membrane of (b) of FIG. 3 in which the fibrils 5 extend in random directions. Both (a) and (b) of FIG. 3 merely show examples for illustration of a preferred embodiment of the present invention and are not intended to limit the present invention to any particular embodiment.

The average node length of the porous PTFE membrane A is 5 or more times, preferably 5.5 or more times, larger than the average fibril length. The upper limit of the ratio of the average node length to the average fibril length is, for example, 15.

The air permeability of the porous PTFE membrane is less affected by the average fibril length, the average node length (or the ratio of the average node length to the average fibril length), and the average node area ratio of the membrane than the water vapor permeability of the membrane. This is based on the fact that the air permeability is considered on the assumption of the occurrence of a difference in air pressure between the two principal surfaces of the porous PTFE membrane, i.e., the fact that when the air permeability is discussed, it is not diffusive migration but rather fluid migration that is dominant in migration of air passing through the porous PTFE membrane. The air permeability of the porous PTFE membrane is affected more by the average pore diameter of the membrane.

In the present specification, the average fibril length, the average node length, and the average node area ratio of a porous PTFE membrane are those determined as follows.

At least five magnified images of a principal surface of the porous PTFE membrane to be evaluated are obtained at different locations on the principal surface by means such as a SEM. The means used to obtain the magnified images is preferably, but not limited to, a SEM, and may be any other means that allows sufficient observation of the form of the nodes and fibrils of the porous membrane. Next, each magnified image is subjected to image analysis to evaluate the lengths of at least 10 nodes and the lengths of at least 10 fibrils in a 1250 μm×850 μm observation region. The nodes and fibrils whose lengths are to be evaluated are selected to include the node and fibril having the smallest length among those present in the observation area and the node and fibril having the largest length among those present in the observation area. Next, the averages of the lengths of all the evaluated nodes and fibrils (at least 50 nodes and at least 50 fibrils) are determined as the average node length and average fibril length. The 1250 μm×850 μm observation region on each magnified image is subjected to image analysis to evaluate the ratio (%) of the area occupied by the nodes on the basis of the pixel ratio on the image, and the average of the area ratio values obtained for the at least five magnified images is determined as the average node area ratio of the porous membrane.

The nodes of the porous PTFE membrane A may extend predominantly in a certain direction. This direction is, for example, a TD direction (transverse direction) of the porous membrane. When the porous PTFE membrane is strip-shaped, the TD direction typically corresponds to the width direction of the membrane. The node of the porous PTFE membrane A presents little width variation in the direction in which the node extends, and can have a high value of aspect ratio which refers to the ratio of length to width. The aspect ratio (length/width) is, for example, 5 or more, and may be 20 or more. The width of the node is, for example, 0.3 μm or more and may be 1 μm or more or even 2 μm or more. The upper limit of the width of the node is, for example, 20 μm. In the porous PTFE membrane A, the proportion of short nodes is low. The ratio of the area occupied by nodes having a node length less than 50 μm may be 10% or less with respect to the total node area. The porous PTFE membrane A has an average node length 5 or more times larger than the average fibril length which is as large as 50 μm or more, and at the same time has a node area ratio as low as 5% or less.

The fibrils of the porous PTFE membrane A may extend predominantly in a direction approximately perpendicular to the direction in which the nodes extend. The approximately perpendicular direction is, for example, an MD direction (machine direction) of the porous membrane. When the porous PTFE membrane is strip-shaped, the MD direction typically corresponds to the longitudinal direction of the membrane.

The porous PTFE membrane A may have an average tortuosity of 1.5 or less in the thickness direction of the membrane. The average tortuosity is a value expressed as a ratio $L/L_0$, where $L_0$ denotes the thickness of the porous membrane to be evaluated and L denotes the average length of the diffusion paths 4 of water vapor. As understood from the foregoing description, the diffusion path 4 refers to the shortest path of water vapor diffusion that extends in the thickness direction of the porous PTFE membrane in such a way as to bypass the nodes 2 and fibrils 5. The average length L of the diffusion paths 4 depends on the structure of the porous PTFE membrane, in particular the configuration of the nodes 2 and fibrils 5. As the average tortuosity becomes closer to 1, the diffusion paths 4 approximate to a straight line extending in the thickness direction of the porous membrane 1, and the water vapor permeability of the porous PTFE membrane increases.

The average tortuosity of the porous PTFE membrane A in the thickness direction may be 1.3 or less. Such a low average tortuosity is difficult to achieve only by a common stretching technique. A porous PTFE membrane having undergone sticking treatment described below can have such a low average tortuosity.

In the present specification, the average tortuosity of the porous PTFE membrane in the thickness direction is that determined as follows.

First, a three-dimensional image including a cross-section along the thickness direction of the porous PTFE membrane to be evaluated is obtained by means such as X-ray CT. The means may be any means that allows sufficient observation of the form of the nodes and fibrils of the porous membrane in the cross-section. Next, the cross-section along the thickness direction of the membrane in the obtained three-dimensional image is subjected to image analysis to extract center lines of voids exclusive of the nodes and fibrils. Next, at least 100 shortest paths extending through the entire thickness of the porous membrane along the extracted center lines are selected by image analysis in a 15-μm-wide region of the cross-section, and the average of the lengths of the selected shortest paths is determined as the average length L of the diffusion paths 4 in the porous PTFE membrane to be evaluated. The average length L thus determined is divided by the thickness $L_0$ of the porous PTFE membrane to obtain the average tortuosity of the porous membrane. The selection of the shortest paths is carried out so that the selected shortest paths include the path having the largest length and the path having the smallest length in the region.

The porous PTFE membrane of the present invention may have a porosity of, for example, 90% or more. The porosity may be 93% or more. The porosity can be determined as follows.

The porous PTFE membrane to be evaluated is punched to give a sample with a predetermined area (17.35 cm$^2$), and the thickness of this sample is measured with a dial thickness gauge (the average of thicknesses measured at 10 points is obtained). The weight W1 of the sample is also measured with an electric balance. Next, the volume of the sample is determined from the area and average thickness, and the determined volume is multiplied by the specific gravity (2.18 g/cm$^3$) of sintered PTFE to determine the weight W0 of a PTFE sintered body which has the same volume as the sample on the assumption of a porosity of 0%. Next, the porosity of the porous PTFE membrane can be determined by the following equation: Porosity (%)=W1/W0×100.

The water vapor permeability of the porous PTFE membrane of the present invention can be increased by 20% or more through the sticking treatment described below, depending on the structural features of the porous membrane.

The water entry pressure of the porous PTFE membrane of the present invention (the water entry pressure as measured according to method B (high hydraulic pressure method) of water penetration test specified in JIS L 1092) is, for example, 10 kPa or more, and can be 20 kPa or more depending on the structural features of the porous membrane. Such a porous PTFE membrane is suitable as a waterproof air-permeable membrane such as, in particular, a waterproof air-permeable membrane for use in a housing of an electrical component such as a lamp. Naturally, the application of the porous PTFE membrane of the present invention is not limited to a waterproof air-permeable membrane. The porous PTFE membrane A can, despite the average node area ratio being small, have waterproof property attributed to the average fibril length lying within the specific range and the large ratio of the average node length to the average fibril length.

The thickness of the porous PTFE membrane of the present invention is, for example, 5 to 60 μm, and preferably 20 to 40 μm.

The porous PTFE membrane of the present invention may be subjected to liquid-repellent treatment such as water-repellent treatment or oil-repellent treatment. The liquid-repellent treatment of the porous PTFE membrane can be carried out by coating with a liquid-repellent substance such as a fluorine compound, and the coating can be accomplished using a known method.

Figure 4:
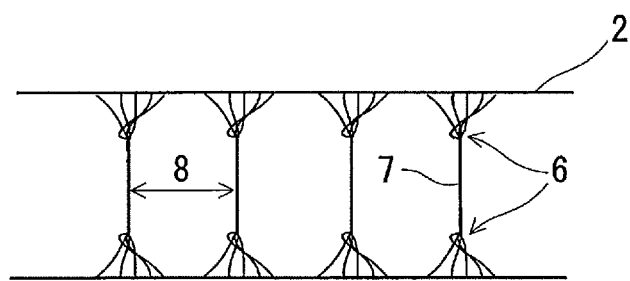
FIG. 4 is a schematic diagram for illustrating an example of the membrane structure that a porous PTFE membrane of the present invention can have.

In an embodiment of the porous PTFE membrane of the present invention, the fibrils have branch portions. As shown in FIG. 4, branch portions 6 are situated between a pair of nodes 2 to which both ends of the fibril 5 having the branch portions 6 are connected. The branch portions 6 are branches originating from the fibrils 5 themselves, rather than branches resulting from branching between the nodes 2 and the fibrils 5. Such branch portions 6 are formed, for example, by subjecting the porous PTFE membrane to sticking treatment for bundling the plurality of fibrils 5 adjacent to each other. Two or more branch portions 6 can exist between a pair of the nodes 2. Typically, the fibrils 5 may present an increase in width at a segment (bundled portion 7) composed of the bundled fibrils 5 and situated between the branch portions 6. The width of the bundle of the fibrils 5 at the bundled portion 7 is, for example, 5 to 50 times larger than the width of the unbundled fibrils 5 in a segment other than the bundled portion 7 and, more specifically, may be 0.5 to 5 μm, for example. The branch portions 6 and the bundled portions 7 are fibrous bodies resulting from formation of a plurality of fibrils 5 by stretching of a PTFE sheet and the subsequent binding of the plurality of fibrils 5 to each other.

Also in this embodiment, the average fibril length, the average node length, and the average node area ratio may be within the ranges described above for the porous PTFE membrane A. Additionally, the bundling of the plurality of adjacent fibrils results in extended voids 8 between the adjacent bundled portions 7. Thus, this embodiment can provide a further improvement in the water vapor permeability in the thickness direction.

Also in this embodiment, the fibrils 5 may be fibrils that extend predominantly in a certain direction such as a direction approximately perpendicular to the direction in which the nodes extend.

Even without taking into account the average fibril length, the average node length, and the average node area ratio, the porous PTFE membrane A is a novel membrane in that the water vapor permeability in the thickness direction of the membrane, as measured according to JIS L 1099 (method B-1), is 150000 g/(m$^2$·day) or more. The porous PTFE membrane A is a novel membrane also in that the water vapor permeability in the thickness direction of the membrane, as measured according to JIS Z 0208 (dish method), is 9000 g/(m$^2$·day) or more.

A waterproof air-permeable membrane of the present invention includes the above-described porous PTFE membrane of the present invention. The application and use of the waterproof air-permeable membrane are not limited to specific ones. The waterproof air-permeable membrane of the present invention can be used, for example, by being attached to a housing of an electrical component for vehicles, such as a lamp, a pressure sensor, an ECU, or a secondary battery-containing case or of any other electrical device. Specifically, the waterproof air-permeable membrane can be used by being attached to an opening of a housing so as to cover the opening. Such use of the waterproof air-permeable membrane can, for example, reduce entry of foreign matter such as dust and/or water into the housing while ensuring air permeability between the inside and outside of the housing. Additionally, the waterproof air-permeable membrane of the present invention can have high water vapor permeability in the thickness direction of the membrane. Thus, for example, water vapor residing inside the housing for the previously described reason can be quickly discharged out of the housing.

The thickness of the waterproof air-permeable membrane of the present invention is, for example, 5 to 60 μm and preferably 20 to 40 μm.

The waterproof air-permeable membrane of the present invention may be subjected to coloring treatment. The color of a porous PTFE membrane not subjected to any coloring treatment and the color of a waterproof air-permeable membrane including this porous membrane are generally white. When such a waterproof air-permeable membrane is placed to cover an opening of a housing, the membrane may be visually conspicuous. Such a conspicuous membrane may arouse the curiosity of the user and induce the user to stub the waterproof air-permeable membrane by means such as a needle, thereby impairing the function of the membrane.

When the waterproof air-permeable membrane is subjected to coloring treatment so that, for example, the membrane has a color identical or similar to the color of the housing, the attention of the user toward the membrane can be relatively reduced. Besides, a colored waterproof air-permeable membrane is demanded in some cases, and such a demand can be met by the coloring treatment.

The coloring treatment can be carried out, for example, by dyeing the porous PTFE membrane or incorporating a colorant into the porous PTFE membrane. The coloring treatment may be carried out, for example, to enable the membrane to absorb light in the wavelength range of 380 nm to 500 nm, inclusive. In this case, the waterproof air-permeable membrane can be colored blue, gray, brown, pink, green, or yellow, for example. The waterproof air-permeable membrane may be colored black, gray, brown, or pink by the coloring treatment.

Figure 5:
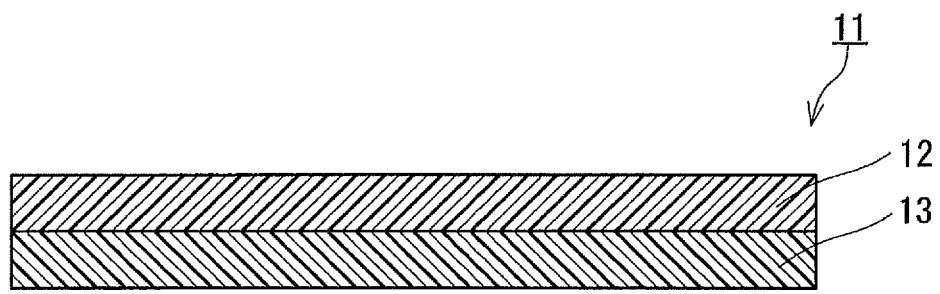
FIG. 5 is a cross-sectional view schematically showing an example of the waterproof air-permeable membrane of the present invention.

The waterproof air-permeable membrane of the present invention can include an optional member in addition to the porous PTFE membrane of the present invention. This member is, for example, an air-permeable supporting layer 13 shown in FIG. 5. A waterproof air-permeable membrane 11 shown in FIG. 5 includes a porous PTFE membrane 12 of the present invention and the air-permeable supporting layer 13 placed on one principal surface of the porous membrane 12. The placement of the air-permeable supporting layer 13 improves the strength and handleability of the waterproof air-permeable membrane 11.

The air-permeable supporting layer 13 is preferably a layer having higher air permeability and water vapor permeability in the thickness direction than the porous PTFE membrane 12. As the air-permeable supporting layer 13 there can be used, for example, a woven fabric, a non-woven fabric, a net, or a mesh. The material forming the air-permeable supporting layer 13 is, for example, polyester, polyethylene, or aramid resin. The shape of the air-permeable supporting layer 13 may be the same or different from the shape of the porous PTFE membrane 12. For example, the air-permeable supporting layer 13 can have a shape adapted for placement only on the peripheral portion of the porous PTFE membrane 12 (in particular, when the porous PTFE membrane 12 is circular, the air-permeable supporting layer 13 can be a ring-shaped layer placed only on the peripheral portion of the circular porous PTFE membrane 12). The placement of the air-permeable supporting layer 13 can be accomplished by a technique such as heat welding to the porous PTFE membrane 12 or bonding to the porous PTFE membrane 12 by means of an adhesive. The air-permeable supporting layer 13 may be placed on one principal surface or both principal surfaces of the porous PTFE membrane 12.

The waterproof air-permeable membrane of the present invention can exhibit various properties attributed to the above-described porous PTFE membrane of the present invention.

Figure 6:
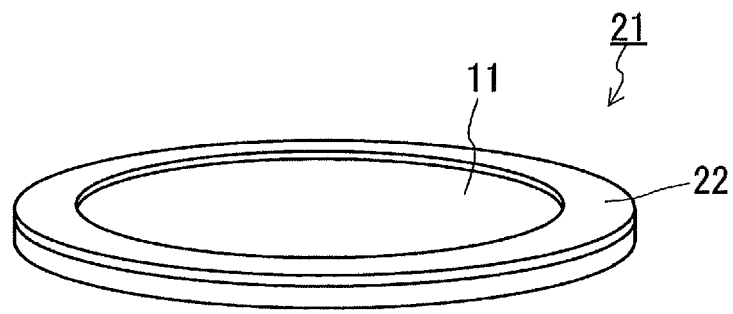
FIG. 6 is a perspective view schematically showing an example of the waterproof air-permeable member of the present invention.

An example of the waterproof air-permeable member of the present invention is shown in FIG. 6. A waterproof air-permeable member 21 shown in FIG. 6 includes: a waterproof air-permeable membrane 11 which is circular in shape when viewed in a direction perpendicular to the principal surfaces of the membrane; and a support 22 which is a ring-shaped sheet joined to the peripheral portion of the membrane 11. The joining of the support 22 to the waterproof air-permeable membrane 11 reinforces the waterproof air-permeable membrane 11 and improves the handleability of the membrane 11. Additionally, when the waterproof air-permeable member 21 is placed to a portion such as an opening of a housing, the support 22 can serve as an attachment member attached to the portion, thus making easy the operation of attachment of the waterproof air-permeable membrane 11.

Figure 7:
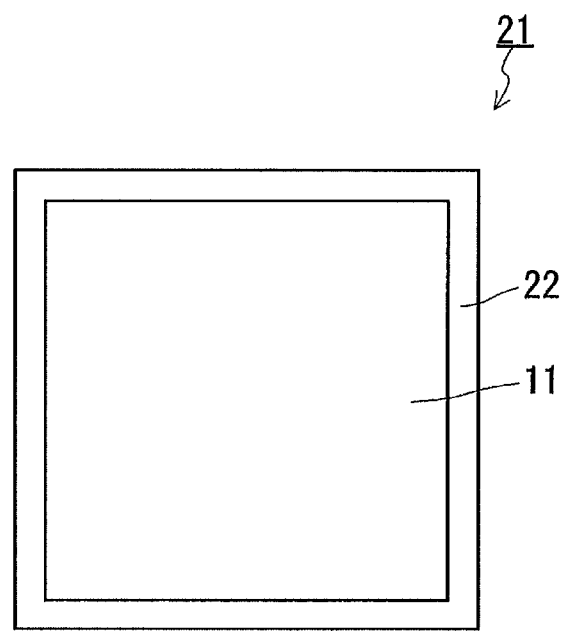
FIG. 7 is a plan view schematically showing an example of the waterproof air-permeable member of the present invention.

The shape of the support 22 is not limited. For example, as shown in FIG. 7, the support 22 may be a frame-shaped sheet that is rectangular in shape when viewed in a direction perpendicular to the principal surfaces of the membrane and that is joined to the peripheral portion of the waterproof air-permeable membrane 11. When, as shown in FIGS. 6 and 7, the support 22 is conformed to the shape of the peripheral portion of the waterproof air-permeable membrane 11, the decrease in air permeability of the waterproof air-permeable membrane 11 due to the placement of the support 22 is reduced. The support 22 is preferably sheet-shaped from the viewpoint of the handleability of the waterproof air-permeable member 21 and the ease of placement of the waterproof air-permeable member 21 to, in particular inside, the housing. In the examples shown in FIGS. 6 and 7, the waterproof air-permeable membrane 11 is bare (i.e., both surfaces of the waterproof air-permeable membrane 11 are uncovered), except for the peripheral portion on which the support 22 is placed.

The material forming the support 22 is, for example, a resin, a metal, or a composite thereof. Examples of the resin include: polyolefins such as polyethylene and polypropylene; polyesters such as polyethylene terephthalate (PET) and polycarbonate; polyimides; and composites of these resins. Examples of the metal include highly corrosion-resistant metals such as stainless steel and aluminum.

The thickness of the support 22 is, for example, 5 to 500 μm and is preferably 25 to 200 μm. Taking into account the function of the support 22 as an attachment member, the appropriate ring width (or frame width, which corresponds to the difference between the outer and inner dimensions) is about 0.5 to 2 mm. A foam made of the resin as mentioned above may be used as the support 22.

The method for joining the waterproof air-permeable membrane 11 to the support 22 is not particularly limited. For example, methods such as heat welding, ultrasonic welding, bonding by means of an adhesive, and bonding by means of a double-coated adhesive tape can be employed. The support 22 may itself be a double-coated adhesive tape.

The waterproof air-permeable member 21 may include two or more waterproof air-permeable membranes 11 and/or two or more supports 22.

The waterproof air-permeable member of the present invention can be used in the same applications as conventional waterproof air-permeable members.

The porous PTFE membrane of the present invention can be produced, for example, by the below-described method for producing a porous PTFE membrane. The porous PTFE membrane of the present invention can be a membrane obtained by the below-described method for producing a porous PTFE membrane.

A method disclosed herein for producing a porous PTFE membrane (a production method of the present disclosure) includes:

stretching an unsintered PTFE sheet in a predetermined direction at a stretching temperature equal to or higher than the melting point of PTFE and a linear stretching rate of 1.0 m/min or less (stretching A); and further stretching the sheet subjected to the stretching A in a direction different from the predetermined direction (stretching B).

(Stretching A)

The technique used for the stretching A is not limited to any specific one, as long as an unsintered PTFE sheet is stretched at a temperature equal to or higher than the melting point of PTFE (327° C.) and a linear stretching rate of 1.0 m/min or less. For example, an unsintered PTFE sheet may be stretched in a heating furnace held at a temperature equal to or higher than the melting point while the linear stretching rate is maintained at 1.0 m/min or less. The stretching A can form PTFE aggregated portions which may be termed "precursors" of the nodes. The PTFE aggregated portions can, after the stretching B, become nodes which are long despite presenting a small area ratio relative to the area of the resulting membrane. The aggregated portions can be formed in the PTFE sheet in such a manner that the adjacent aggregated portions are approximately parallel to each other. The direction in which the aggregated portions extend is typically a direction approximately perpendicular to the direction of the stretching A in the sheet plane. The stretching A can form fibrils which can attain an average fibril length of 50 μm or more after the stretching B. The direction in which the fibrils extend can be a direction approximately perpendicular to the direction in which the aggregated portions extend in the sheet plane.

The direction (predetermined direction) of the stretching A is not particularly limited and is, for example, an MD direction of the PTFE sheet. When the sheet is strip-shaped, the direction may be the longitudinal direction of the sheet.

The stretching ratio in the stretching A is, for example, 8 to 50 and preferably 15 to 35.

The temperature (stretching temperature) at which the stretching A is carried out only has to be equal to or higher than the melting point of PTFE. This temperature is, for example, 350 to 420° C. and preferably 360 to 400° C.

The linear stretching rate in the stretching A is 1.0 m/min or less and preferably 0.5 m/min or less. The linear stretching rate is based on a reference length of 1.5 m. That is, assuming a sheet with the reference length of 1.5 m, for example, stretching at a linear stretching rate of 1.0 m/min or less means stretching the sheet at a rate of 1.0 m/min or less in the direction of the reference length. When a pair of rolls operating to create a difference in travel speed are used to stretch the sheet, the travel distance of the sheet between the pair of rolls (the distance over which the sheet travels until the sheet comes into contact with the second roll after leaving the first roll) can be set to the reference length.

(Stretching B)

The technique used for the stretching B is not limited to any specific one, as long as the PTFE sheet subjected to the stretching A is stretched in a direction different from the direction of the stretching A.

The direction of the stretching B is not particularly limited and is typically a direction approximately perpendicular to the direction of the stretching A in the sheet plane. The direction of the stretching B is, for example, a TD direction of the PTFE sheet. When the sheet is strip-shaped, the direction can be the width direction of the sheet.

The stretching ratio in the stretching B is, for example, 2 to 15 and preferably 4 to 10.

The temperature (stretching temperature) at which the stretching B is carried out may be equal to, higher than, or lower than the melting point of PTFE. This temperature is, for example, 100 to 400° C. and preferably 120 to 200° C.

The linear stretching rate in the stretching B is not limited and is, for example, 3 m/min to 16 m/min.

In the production method of the present disclosure, an optional stretching process may be carried out in addition to the stretching A and stretching B if necessary. It should be noted that the first stretching performed on the PTFE sheet is preferably the stretching A. The stretching in the above predetermined direction is preferably only the stretching A. In the production method of the present disclosure, only the stretching A and stretching B may be carried out as stretching processes of the PTFE sheet. The stretching B may be performed in continuity with the stretching A.

The method for forming the unsintered PTFE sheet used in the production method of the present disclosure is not particularly limited. For example, the unsintered PTFE sheet can be obtained by forming a mixture of fine PTFE particles (fine powder) and a liquid lubricant into a sheet shape by at least one technique selected from extrusion and rolling. The liquid lubricant is preferably removed from the PTFE sheet prior to the stretching A by a technique such as heating or extraction.

The type of the fine PTFE particles is not particularly limited, and a commercially-available product can be used. Examples of commercially-available fine PTFE particles include POLYFLON F-104 (manufactured by Daikin Industries, Ltd.), Fluon CD-123 and Fluon CD-129E (manufactured by Asahi-ICI Fluoropolymers Co., Ltd.), and Teflon 6J (manufactured by Du Pont-Mitsui Fluorochemicals Company, Ltd.).

The liquid lubricant is not particularly limited, as long as it is a substance capable of wetting the surface of the fine PTFE particles and being removed by a process such as evaporation and/or extraction after forming of the mixture into a sheet shape. Specific examples of the liquid lubricant include hydrocarbon oils such as liquid paraffin, naphtha, white oil, toluene, and xylene, and a variety of alcohols, ketones, and esters.

The mixing ratio between the fine PTFE particles and the liquid lubricant can be adjusted depending on, for example, the types of the fine PTFE particles and liquid lubricant and the forming method of the PTFE sheet. Typically, the amount of the liquid lubricant is about 5 to 50 parts by weight with respect to 100 parts by weight of the fine PTFE particles.

The methods for the extrusion and rolling are not limited to specific ones. For example, the mixture may be formed into a rod shape by extrusion, and then the rod-shaped body may be formed into a sheet shape by rolling. Alternatively, the mixture may be formed into a sheet shape by extrusion.

The thickness of the unsintered PTFE sheet can be adjusted depending on the thickness of the porous PTFE membrane to be obtained and is, for example, about 0.05 to 0.5 mm.

In the production method of the present disclosure, an optional step may be carried out after the stretching B if necessary. Examples of the optional step include a sintering step, liquid-repellent treatment, and sticking treatment.

In the sintering step, the PTFE sheet subjected to the stretching B (a porous PTFE membrane formed as a result of the stretching B) is heat-treated by heating to a temperature equal to or higher than the melting point of PTFE. The technique for the heat treatment is not limited to any specific one. For example, the stretched PTFE sheet may be left in place in a heating furnace held at a temperature equal to or higher than the melting point.

The heat treatment is preferably carried out while the dimensions of the PTFE sheet are fixed. The temperature of the heat treatment is preferably about 350 to 400° C. The heat treatment may be performed in continuity with the stretching B.

For the liquid-repellent treatment, a known technique can be used.

The sticking treatment is a treatment in which the PTFE sheet subjected to the stretching B (a porous PTFE membrane formed as a result of the stretching B) is brought into contact with a low-surface tension liquid to bundle a plurality of adjacent fibrils formed through the stretching A in the predetermined direction and the stretching B in the different direction. This treatment results in, for example, the porous PTFE membrane 1 as shown in FIG. 4.

The sticking treatment can be carried out, for example, by immersing the PTFE sheet subjected to the stretching B into a low-surface tension liquid. After being immersed for a predetermined time, the PTFE sheet may be taken out of the liquid and dried. A reinforcing layer such as a non-woven fabric may be joined to the PTFE sheet subjected to the stretching B, and the sheet with the reinforcing layer may be immersed in the liquid. This allows the sticking treatment to be accomplished more stably and reliably.

The low-surface tension liquid may be any liquid having a low surface tension and capable of infiltrating the small interstices between the fibrils of the PTFE sheet (porous PTFE membrane) subjected to the stretching B. Specifically, the surface tension of the liquid is 30 mN/m or less and preferably 25 mN/m or less. Examples of the liquid include alcohols such as methanol and ethanol and ethers. The liquid used can be a commercially-available liquid such as Novec (registered trademark), a hydrofluoroether manufactured by Sumitomo 3M Ltd.

When the sintering step, liquid-repellent treatment, and/or sticking treatment are carried out, the liquid-repellent treatment and the sticking treatment are preferably performed after the sintering step.

With the production method of the present disclosure, for example, the porous PTFE membrane A can be produced.

The production method of the present disclosure may include an optional step other than those described above, as long as the effect of the present invention is obtained.

EXAMPLES

Hereinafter, the present invention will be described in more detail by examples. The present invention is not limited to the examples given below.

First, methods for evaluation of porous PTFE membranes produced in the examples will be described.

[Average Fibril Length, Average Node Length, and Average Node Area Ratio]

The average fibril length, average node length, and average node area ratio of each porous PTFE membrane were determined by obtaining magnified images of the principal surface of the to-be-evaluated porous PTFE membrane with a SEM (JSM-6510LV, manufactured by JEOL) and by performing the method previously described.

[Average Tortuosity]

The average tortuosity of the porous PTFE membrane in the thickness direction was determined by the method previously described.

[Waterproof Property]

The waterproof property of the porous PTFE membrane was evaluated by a water entry pressure (kPa) as measured according to method B (high hydraulic pressure method) of water penetration test specified in JIS L 1092:2009. The water entry pressure was evaluated based on a water pressure that caused water to leak from one region of the surface of the porous PTFE membrane.

[Porosity]

The porosity of the porous PTFE membrane was determined by the method previously described.

[Water Vapor Permeability]

Evaluation method 1: The water vapor permeability of the porous PTFE membrane was evaluated according to JIS Z 0208:1976 (water vapor permeability test, dish method). In evaluation of the water vapor permeability, the atmosphere in contact with one principal surface of the porous PTFE membrane was controlled to a temperature of 40° C. and a humidity of 100% RH, while the atmosphere in contact with the other principal surface of the membrane was controlled to a temperature of 40° C. and a humidity of 50% RH.

Evaluation method 2: The water vapor permeability of the porous PTFE membrane was evaluated according to JIS L 1099:2012 (method B-1; potassium acetate method). The water vapor permeability of an auxiliary film specified in this standard for use in water vapor permeability measurement is in the range of 75000 to 85000 g/(m²·day) as determined by the measurement according to the JIS standard. The water vapor permeability of an auxiliary film can be measured by using two films, one of which is the auxiliary film as a measurement object and the other of which is a film identical to the auxiliary film and serving as an auxiliary in the measurement.

Example 1

100 parts by weight of a fine PTFE powder (Fluon CD-129E, manufactured by Asahi-ICI Fluoropolymers Co., Ltd.) and 19.7 parts by weight of an aliphatic hydrocarbon as a liquid lubricant were uniformly mixed to prepare a PTFE paste. Next, the prepared PTFE paste was extruded into a sheet shape using an FT die at a pressure of 2.5 MPa (25 kg/cm²), and the sheet-shaped body was rolled with a pair of metal rolls to obtain a thickness-adjusted, strip-shaped PTFE sheet (thickness: 0.2 mm). Next, the obtained PTFE sheet was heated and dried to remove the liquid lubricant.

Next, while the dried strip-shaped PTFE sheet was fed continuously, the sheet was uniaxially stretched in the longitudinal direction of the sheet at a linear stretching rate of 0.4 m/min in a heating furnace held at 360° C. (stretching A). The stretching ratio in this stretching was 20.

Figure 8:
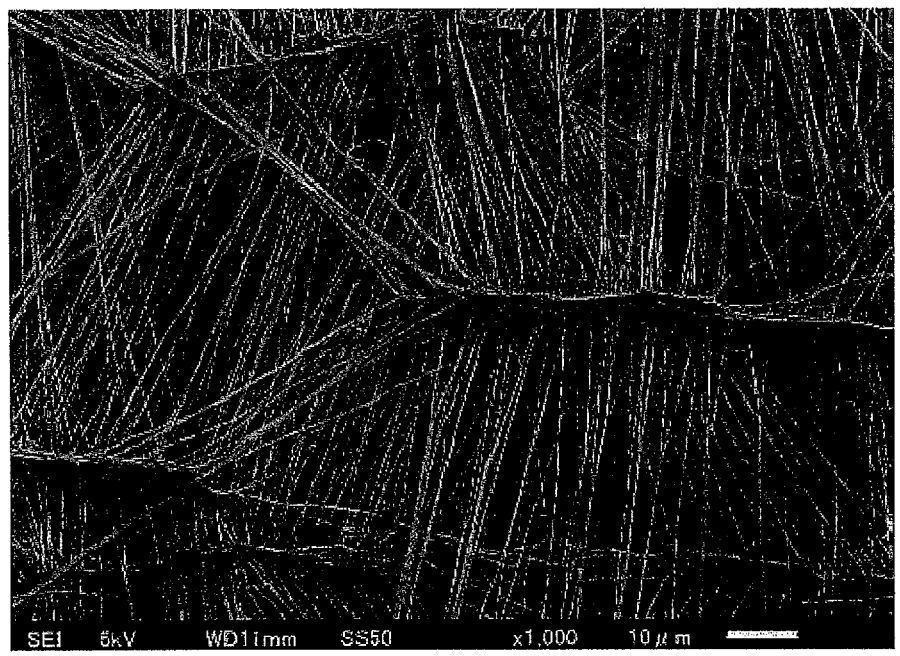
FIG. 8 shows a scanning electron microscope (hereinafter referred to as "SEM") image of a porous PTFE membrane produced in Example 1.

Next, the PTFE sheet subjected to the stretching A was uniaxially stretched in the width direction of the sheet at a linear stretching rate of 12 m/min in a heating furnace held at 130° C. (stretching B). The stretching ratio in this stretching was 5. Thus, a stretched porous PTFE membrane of Example 1 was obtained. A SEM image of the porous PTFE membrane of Example 1 is shown in FIG. 8.

Example 2

Figure 9:
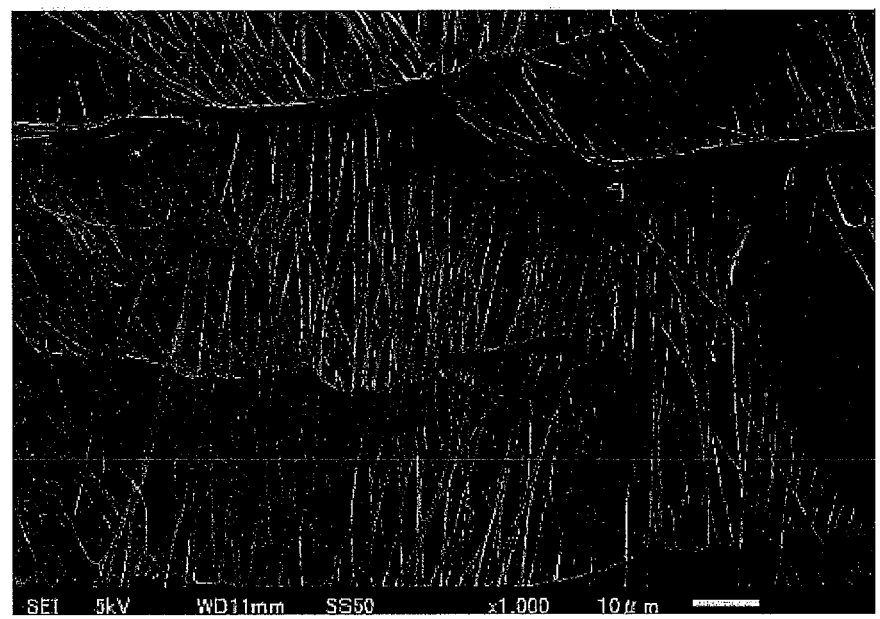
FIG. 9 shows a SEM image of a porous PTFE membrane produced in Example 2.

The porous PTFE membrane produced in Example 1 was subjected to sticking treatment by immersing the porous membrane in Novec 7300, a hydrofluoroether manufactured by Sumitomo 3M Ltd. The immersed porous PTFE membrane was dried to give a porous PTFE membrane of Example 2. A SEM image of the porous PTFE membrane of Example 2 is shown in FIG. 9.

Example 3

A porous PTFE membrane of Example 3 was obtained in the same manner as that of Example 1, except that the linear stretching rate in the stretching A was 0.8 m/min.

Example 4

A porous PTFE membrane of Example 4 was obtained by subjecting the porous PTFE membrane produced in Example 3 to sticking treatment identical to that in Example 2.

Comparative Example 1

100 parts by weight of a fine PTFE powder (Fluon CD-129E, manufactured by Asahi-ICI Fluoropolymers Co., Ltd.) and 19.7 parts by weight of an aliphatic hydrocarbon as a liquid lubricant were uniformly mixed to prepare a PTFE paste. Next, the prepared PTFE paste was extruded into a sheet shape using an FT die at a pressure of 2.5 MPa (25 kg/cm$^2$), and the sheet-shaped body was rolled with a pair of metal rolls to obtain a thickness-adjusted, strip-shaped PTFE sheet (thickness: 0.5 mm). Next, the obtained PTFE sheet was heated and dried to remove the liquid lubricant.

Next, while the dried strip-shaped PTFE sheet was fed continuously, the sheet was uniaxially stretched in the longitudinal direction of the sheet at a linear stretching rate of 12 m/min by means of a hot roll held at 100° C. The stretching ratio in this stretching was 4.

Next, the stretched PTFE sheet was uniaxially stretched further in the longitudinal direction of the sheet at a linear stretching rate of 1.5 m/min in a heating furnace held at 380° C. The stretching ratio in this stretching was 8.

Figure 10:
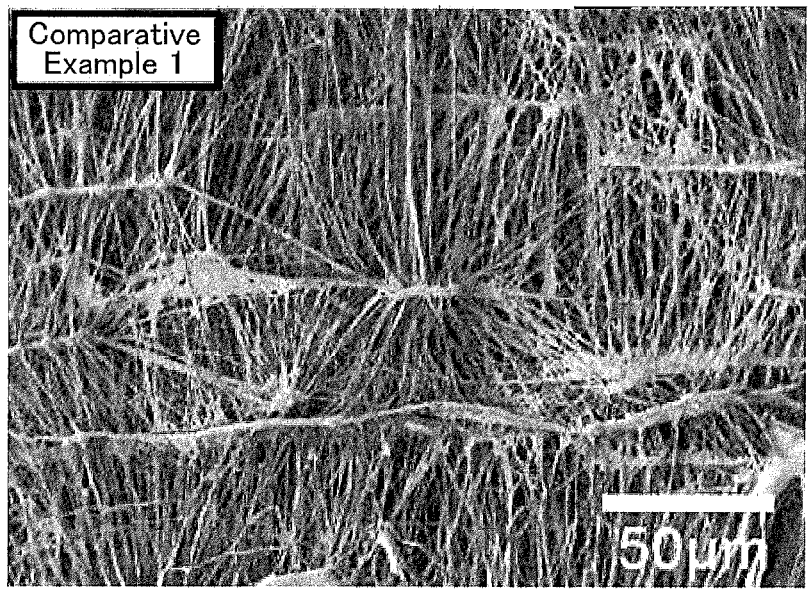
FIG. 10 shows a SEM image of a porous PTFE membrane produced in Comparative Example 1.

Next, the stretched PTFE sheet was uniaxially stretched in the width direction of the sheet at a linear stretching rate of 12 m/min in a heating furnace held at 130° C. The stretching ratio in this stretching was 5. A SEM image of the thus obtained porous PTFE membrane of Comparative Example 1 is shown in FIG. 10.

Comparative Example 2

100 parts by weight of a fine PTFE powder (Fluon CD-129E, manufactured by Asahi-ICI Fluoropolymers Co., Ltd.) and 19.7 parts by weight of an aliphatic hydrocarbon as a liquid lubricant were uniformly mixed to prepare a PTFE paste. Next, the prepared PTFE paste was extruded into a sheet shape using an FT die at a pressure of 2.5 MPa (25 kg/cm$^2$), and the sheet-shaped body was rolled with a pair of metal rolls to obtain a thickness-adjusted, strip-shaped PTFE sheet (thickness: 0.5 mm). Next, the obtained PTFE sheet was heated and dried to remove the liquid lubricant.

Next, while the dried strip-shaped PTFE sheet was fed continuously, the sheet was uniaxially stretched in the longitudinal direction of the sheet at a linear stretching rate of 6 m/min by means of a hot roll held at 150° C. The stretching ratio in this stretching was 4.

Next, the stretched PTFE sheet was uniaxially stretched further in the longitudinal direction of the sheet at a linear stretching rate of 1.5 m/min in a heating furnace held at 380° C. The stretching ratio in this stretching was 8.

Figure 11:
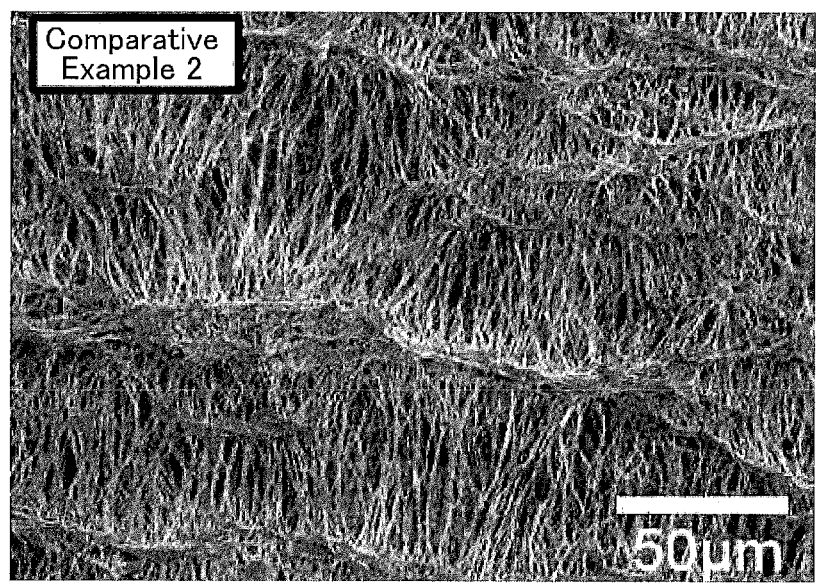
FIG. 11 shows a SEM image of a porous PTFE membrane produced in Comparative Example 2.

Next, the stretched PTFE sheet was uniaxially stretched in the width direction of the sheet at a linear stretching rate of 12 m/min in a heating furnace held at 130° C. The stretching ratio in this stretching was 5. Thus, a stretched porous PTFE membrane of Comparative Example 2 was obtained. A SEM image of the porous PTFE membrane of Comparative Example 2 is shown in FIG. 11.

Comparative Example 3

A porous PTFE membrane of Comparative Example 3 was obtained by subjecting the porous PTFE membrane produced in Comparative Example 2 to sticking treatment identical to that in Example 2.

The evaluation results of the porous PTFE membranes produced in Examples and Comparative Examples are shown in Table 1 below.

TABLE 1

| | Average fibril length (μm) | Average node length (μm) | Average node area ratio (%) | Average tortuosity | Water entry pressure (kPa) | Porosity (%) | Water vapor permeability (g/(m$^2$ · day)) | |
|---|---|---|---|---|---|---|---|---|
| | | | | | | | Evaluation method 1 | Evaluation method 2 |
| Example 1 | 70 | 450 | 2.1 | 1.5 | 25 | 94 | 10500 | 165000 |
| Example 2 | 70 | 450 | 2.1 | 1.2 | 25 | 94 | 13000 | 200000 |
| Example 3 | 70 | 400 | 2.4 | 1.5 | 25 | 94 | 9000 | 155000 |
| Example 4 | 70 | 400 | 2.4 | 1.3 | 25 | 94 | 11500 | 185000 |
| Comparative Example 1 | 50 | 140 | 3.4 | 1.6 | 40 | 85 | 8500 | 100000 |
| Comparative Example 2 | 50 | 240 | 4.8 | 1.7 | 40 | 80 | 8000 | 90000 |
| Comparative Example 3 | 50 | 240 | 4.8 | 1.7 | 40 | 80 | 8000 | 90000 |

Evaluation method 1: JIS Z 0208, Evaluation method 2: JIS L 1099

As shown in Table 1, the porous PTFE membranes of Examples exhibited higher water vapor permeability in the thickness direction than the porous PTFE membranes of Comparative Examples. The porous PTFE membranes of Examples 1 and 3 showed a decrease in average tortuosity and an increase in water vapor permeability in the thickness direction as a result of being subjected to the sticking treatment, whereas the porous PTFE membrane of Comparative Example 2 showed change neither in average tortuosity nor in water vapor permeability in the thickness direction despite being subjected to the sticking treatment.

The present invention may be embodied in other forms without departing from the spirit or essential characteristics thereof. The embodiments disclosed in this specification are to be considered in all respects as illustrative and not limiting. The scope of the present invention is indicated by the appended claims rather than by the foregoing description, and all changes which come within the meaning and range of equivalency of the claims are intended to be embraced therein.

INDUSTRIAL APPLICABILITY

The porous PTFE membrane of the present invention can be used, for example, as a waterproof air-permeable membrane.

The invention claimed is:

1. A porous polytetrafluoroethylene membrane having an average fibril length of 50 μm or more, having an average node length 5 or more times larger than the average fibril length, and having an average node area ratio of 5% or less.

2. The porous polytetrafluoroethylene membrane according to claim 1, wherein the average node area ratio is 3% or less.

3. The porous polytetrafluoroethylene membrane according to claim 1, having an average tortuosity of 1.5 or less in a thickness direction of the membrane.

4. The porous polytetrafluoroethylene membrane according to claim 1, having a water entry pressure, as measured according to method B (high hydraulic pressure method) of water penetration test specified in JIS L 1092, of 10 kPa or more.

5. The porous polytetrafluoroethylene membrane according to claim 1, having a porosity of 90% or more.

6. A waterproof air-permeable membrane comprising the porous polytetrafluoroethylene membrane according to claim 1.

7. A waterproof air-permeable member comprising the waterproof air-permeable membrane according to claim 6 and a support joined to the waterproof air-permeable membrane.

* * * * *